US008878346B2

(12) United States Patent
Chiu et al.

(10) Patent No.: US 8,878,346 B2
(45) Date of Patent: Nov. 4, 2014

(54) MOLDED SIP PACKAGE WITH REINFORCED SOLDER COLUMNS

(75) Inventors: Chin-Tien Chiu, Taichung (TW); Hem Takiar, Fremont, CA (US); Hui Liu, Shanghai (CN); Jiang Hua Java Zhu, Shanghai (CN); Jack Chang-Chien, Kaoshiung (TW); Cheemen Yu, Madison, WI (US)

(73) Assignee: SanDisk Technologies Inc., Plano, TX (US)

( * ) Notice: Subject to any disclaimer, the term of this patent is extended or adjusted under 35 U.S.C. 154(b) by 2093 days.

(21) Appl. No.: 11/414,526

(22) Filed: Apr. 28, 2006

(65) Prior Publication Data
US 2007/0252254 A1    Nov. 1, 2007

(51) Int. Cl.
*H01L 23/495* (2006.01)
*H05K 3/30* (2006.01)
*H05K 3/34* (2006.01)
*H01L 23/00* (2006.01)

(52) U.S. Cl.
CPC .... *H01L 23/562* (2013.01); *H05K 2201/09781* (2013.01); *H01L 2924/1433* (2013.01); *H05K 2203/041* (2013.01); *H05K 3/3421* (2013.01); *H05K 2203/043* (2013.01); *H05K 2201/10689* (2013.01); *H05K 2201/2036* (2013.01); *H01L 24/48* (2013.01); *H01L 2224/48091* (2013.01); *H01L 2224/48257* (2013.01); *H01L 2924/01078* (2013.01); *H01L 2924/01079* (2013.01); *H05K 3/303* (2013.01); *H01L 2224/48247* (2013.01); *H05K 3/3484* (2013.01); *H01L 2225/06562* (2013.01)
USPC ....................................................... 257/666

(58) Field of Classification Search
USPC .......... 257/666, 734–738, 777–787, 678–684
See application file for complete search history.

(56) References Cited

U.S. PATENT DOCUMENTS

| 5,744,383 | A | 4/1998 | Fritz | |
| 6,501,160 | B1 * | 12/2002 | Higuchi et al. | 257/675 |
| 6,731,011 | B2 | 5/2004 | Verma et al. | |
| 6,858,470 | B1 | 2/2005 | Han et al. | |
| 7,247,934 | B2 * | 7/2007 | Pu | 257/686 |
| 2002/0079577 | A1 | 6/2002 | Ho | |
| 2004/0089717 | A1 | 5/2004 | Harari et al. | |
| 2005/0087846 | A1 | 4/2005 | Han et al. | |
| 2006/0125113 | A1 | 6/2006 | Liu et al. | |
| 2006/0151861 | A1 * | 7/2006 | Noquil et al. | 257/676 |
| 2006/0276157 | A1 * | 12/2006 | Chen et al. | 455/333 |
| 2007/0020912 | A1 | 1/2007 | Nishiyama et al. | |
| 2007/0254407 | A1 | 11/2007 | Chiu | |

FOREIGN PATENT DOCUMENTS

JP        60012746        1/1985
WO    2005074337 A1    8/2005

OTHER PUBLICATIONS

Office Action dated Dec. 14, 2007, U.S. Appl. No. 11/414,780.
Response to Office Action dated Apr. 14, 2008, U.S. Appl. No. 11/414,780, filed Apr. 28, 2006.
Notice of Allowance dated Jun. 16, 2008 in U.S. Appl. No. 11/414,780.
International Search Report dated Oct. 18, 2007, International Application No. PCT/US2007/009944.

* cited by examiner

*Primary Examiner* — Cuong Q Nguyen
(74) *Attorney, Agent, or Firm* — Vierra Magen Marcus LLP (57) ABSTRACT

An integrated circuit, and a semiconductor die package formed therefrom, are disclosed including solder columns for adding structural support to the package during the fabrication process.

24 Claims, 5 Drawing Sheets

MOLDED SIP PACKAGE WITH REINFORCED SOLDER COLUMNS

CROSS-REFERENCE TO RELATED APPLICATION

This Application is related to U.S. patent application entitled "Method Of Reducing Mechanical Stress On A Semiconductor Die During Fabrication", Inventors Chin-Tien Chiu, Hem Takiar, Hui Liu, Java Zhu, Jack Chang-Chien and Cheemen Yu, filed on the same day as the present application and incorporated herein by reference in its entirety.

BACKGROUND OF THE INVENTION

1. Field of the Invention

Embodiments of the present invention relate to an integrated circuit, and a semiconductor die package formed therefrom, including solder columns for adding structural support to the package during fabrication.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Figure 1:
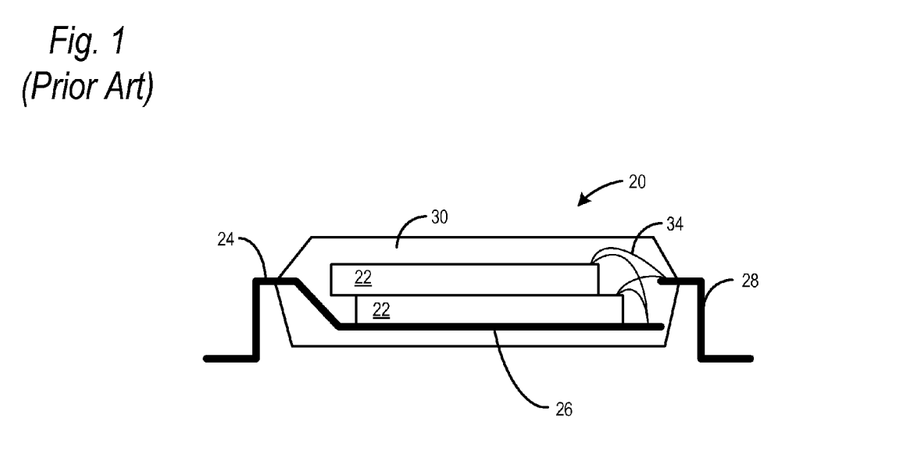
FIG. 1 is a cross-sectional side view of a conventional TSOP semiconductor package.

One branch of semiconductor packaging involves the use of a leadframe, which is a thin layer of metal on which one or more semiconductor die may be mounted. The leadframe includes electrical leads for communicating electrical signals from the one or more semiconductors to a printed circuit board or other external electrical devices. Common leadframe-based packages include plastic small outlined packages (PSOP), thin small outlined packages (TSOP), and shrink small outline packages (SSOP). Components in a conventional leadframe package are shown in FIG. 1. The illustrated components may be used for example in a TSOP package. The package 20 includes a pair of semiconductor die 22 mounted on a leadframe 24. The die 22 are wire bonded with wires 34 to electrical leads 26 and 28 of the leadframe. In embodiments, electrical leads 26 may be angled so as to provide a down-set configuration. After the wire-bond process, semiconductor die 22, wire-bonds 34 and portions of leads 26 and 28 may be encapsulated in molding compound 30 in a known process to form the semiconductor die package 20.

TSOP package 20 may often be included as part of a system-in-a-package (SiP) or multichip modules (MCM), where a plurality of die are mounted on a substrate such as a printed circuit board. The substrate may in general include a rigid, dielectric base having a conductance pattern, generally of copper or copper alloy, etched on respective sides. For example, referring to prior art FIG. 2, the TSOP package 20 may be surface mounted along with other electronic components to a substrate such as a printed circuit board 32 in a known surface mount process. Once electrical connections between the package 20, other electronic components and the substrate 32 are made, the assembly is then typically encased in a molding compound 34 in a transfer molding process (shown taking place in FIG. 2) to form a protected SiP semiconductor package.

Figure 2:
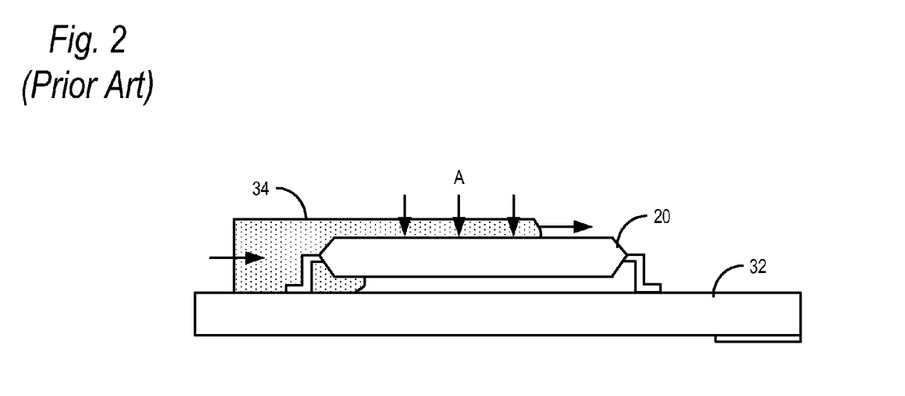
FIG. 2 is a side view of a TSOP package mounted on a substrate during an encapsulation process.

During the transfer molding process, the molding machine may output an injection force typically about 0.8 tons to drive the molding compound 34 into the mold cavity and around the surface mounted components. A problem in conventional transfer molding processes is that the molding compound 34 travels more quickly over the top of surface mounted components, such as TSOP package 20, than into the space between the bottom surface of the component and the printed circuit board 32, as shown in FIG. 2. With the high pressure of the transfer molding process, the molding compound above the TSOP package 20 generates large forces down on the top of the package (indicated by arrows A). For die packages having a footprint of about 4.5 mm by 2.5 mm, the forces down on the top of package 20 may be on the order of about 1.2 kgf/mm$^2$. As there is a void beneath the package during the molding process, these forces generate large stresses within the TSOP package 20.

In the past, the die within the packages were better able to withstand these stresses generated during the transfer molding process. However, the constant drive toward smaller form factor packages require very thin die. It is presently known to employ wafer backgrind during the semiconductor fabrication process to thin die to a range of about 2 mils to 13 mils. At these thicknesses, the die are often not able to withstand the stresses generated during the molding process and they may crack. Die cracking under the stress of the molding process will generally result in the package having to be discarded. Occurring after the TSOP package fabrication process, and at the end of the SiP package fabrication process, this is an especially costly and burdensome problem.

SUMMARY OF THE INVENTION

Embodiments of the invention relate to an integrated circuit, and a semiconductor die package formed therefrom, including solder columns for adding structural support to the package during fabrication. The solder columns may be applied to a substrate such as a printed circuit board in a variety of numbers and patterns to structurally support a leadframe-based package mounted to the substrate on top of the solder columns. The solder columns may be applied as a solder paste or as solder balls in known solder application processes.

After the solder columns have been applied to the substrate, a leadframe-based semiconductor package may be surface mounted to the substrate in a known SMT or other mounting process. The leadframe-based semiconductor package may for example be a TSOP semiconductor package, but other packages and electronic components are contemplated. The substrate may then be heated to reflow and harden the solder in the solder columns and securely affix the leadframe-based semiconductor package to the substrate.

The height of the solder columns is provided so as to lie in contact with the bottom surface of the leadframe-based semiconductor package after the surface mount process. The height of the solder columns when applied may be slightly larger than the space between the leadframe-based semiconductor package and the substrate, so that the package slightly compresses the columns when the package is surface mounted to the substrate. This ensures good contact between the package and solder columns, and good structural support by the solder columns.

After the components are surface mounted to the substrate, the integrated circuit formed thereby may be encapsulated in a molding compound to form a finished SiP semiconductor package. During the encapsulation process, the solder columns serve to drastically reduce mechanical stresses within the leadframe-based semiconductor package. In particular, lying in contact with the bottom surface of the leadframe-based package, the solder columns provide an equal and opposite force to counteract the forces exerted on the leadframe-based semiconductor package by the molding compound during the encapsulation process.

DETAILED DESCRIPTION

Embodiments of the invention will now be described with reference to FIGS. 3 through 10, which relate to an integrated circuit, and a semiconductor die package formed therefrom, including solder columns for adding structural support to the package during fabrication. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 3:
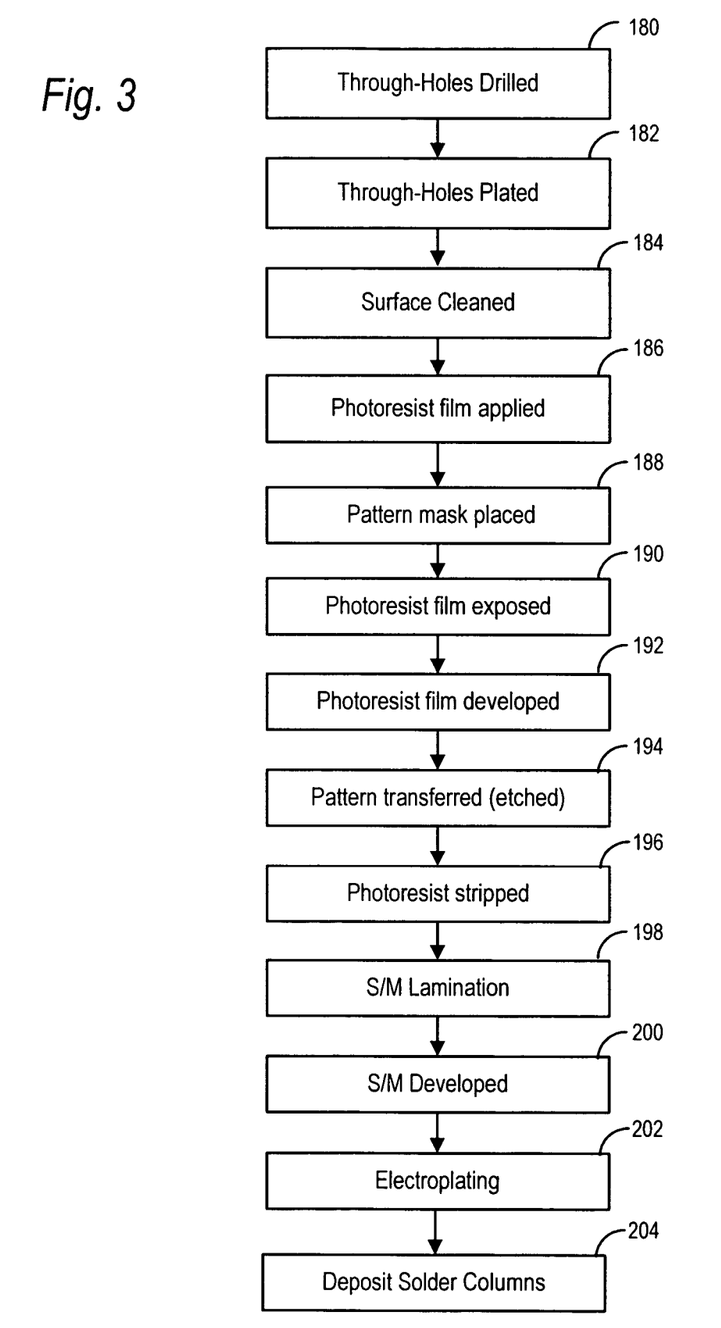
FIG. 3 is a flowchart for constructing an integrated circuit and semiconductor package according to the present invention.
Figure 4:
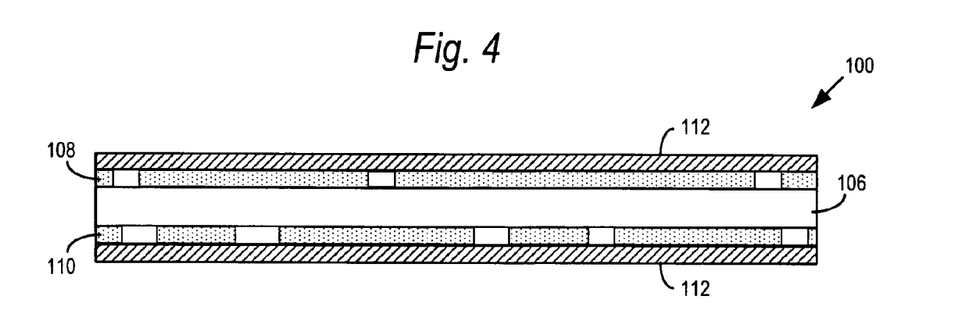
FIG. 4 is a cross-sectional side view of a substrate for use in accordance with the present invention.

Embodiments of the present invention are described initially with reference to the flowchart of FIG. 3 and the cross-sectional side views of FIGS. 3 through 6. FIG. 4 shows a substrate 100 on which an SiP semiconductor package may be formed. Substrate 100 may be part of a substrate panel for batch processing a plurality of semiconductor packages. It is understood that the present invention is not limited to SiP semiconductor packages, and that the present invention may be used to fabricate a plurality of different semiconductor package configurations.

Substrate 100 may be a variety of different chip carrier mediums, including a PCB, a leadframe or a tape automated bonded (TAB) tape. Where substrate 100 is PCB, the substrate may be formed of a core 106, having a top conductive layer 108 formed on a top surface of the core 106, and a bottom conductive layer 110 formed on the bottom surface of the core. The core 106 may be formed of various dielectric materials such as for example, polyimide laminates, epoxy resins including FR4 and FR5, bismaleimide triazine (BT), and the like. Although not critical to the present invention, core 106 may have a thickness of between 40 microns ($\mu$m) to 200 $\mu$m, although the thickness of the core may vary outside of that range in alternative embodiments. The core 106 may be ceramic or organic in alternative embodiments.

The conductive layers 108 and 110 may be formed of copper or copper alloys, plated copper or plated copper alloys, Alloy 42 (42Fe/58Ni), copper plated steel, or other metals and materials known for use on substrates. The layers 108 and 110 may have a thickness of about 10 $\mu$m to 24 $\mu$m, although the thickness of the layers 108 and 110 may vary outside of that range in alternative embodiments.

Referring now to the flowchart of FIG. 3, the substrate 100 may be fabricated by initially drilling through-holes, or vias, through the substrate in step 180, and plating the holes in step 182 to allow electrical communication between the conductive layers 108 and 110. The layers 108 and 110 may next be cleaned in step 184, and then etched with a conductance pattern to form a network of electrical traces in the layers 108 and 110 for signal and voltage (power/ground) communication. One process for forming the conductance pattern on the substrate 100 includes the step 186 of applying a photoresist film over the surfaces of layers 108 and 110. A pattern mask containing the outline of the electrical conductance pattern(s) may then be placed over the photoresist film in step 188. The photoresist film is exposed (step 190) and developed (step 192) to remove the photoresist from areas on the conductive layers that are to be etched. The exposed areas are next etched away using an etchant such as ferric chloride in step 194 to define the conductance patterns on the core. Next, the photoresist is removed in step 196. Other known methods for forming the conductance pattern on substrate 100 are contemplated. Once patterned, the top and bottom conductive layers 108, 110 may be laminated with a solder mask 112 in a step 198 to provide the structure shown in FIG. 4.

Figure 5:
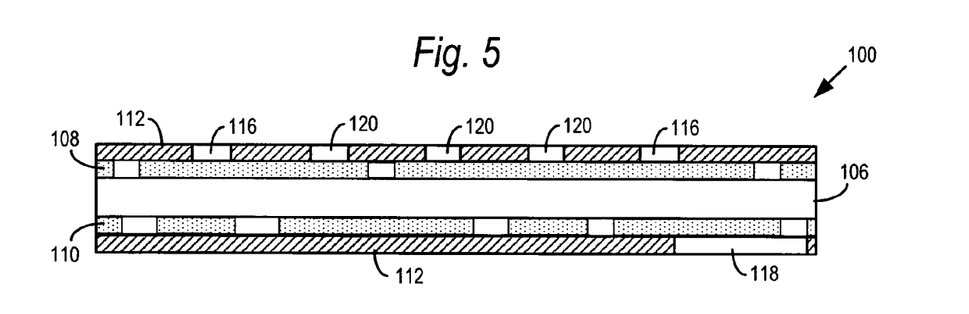
FIG. 5 is a cross-sectional side view of a substrate as in FIG. 4, with the solder mask developed to expose areas of the conductance pattern.

In step 200, the solder mask 112 may be developed to expose areas 116, 118 and 120 on the conductance pattern as shown in FIG. 5. Areas 116 may form solder pads to which electronic components such as a TSOP semiconductor package may be surface mounted as explained hereinafter. Areas 118 may form contact fingers for establishing electrical connection between the finished SiP semiconductor package and an external host device. And areas 120 may be for receiving solder columns in accordance with embodiments of the present invention as explained hereinafter. The areas 120 may be approximately 300 $\mu$m square, though it is understood that the areas 120 may be larger or smaller than that in alternative embodiments of the present invention. There may be many more areas 116, 118 and 120 than are shown in the figures.

In order to facilitate the surface mount of components and to protect the contact fingers, the areas 116, 118 and 120 may be plated with a layer of resistive metal in step 202 in a known electroplating process. The areas 116, 118 and 120 of the conductance pattern may be plated with a metal film, such as for example gold, though other metals, including tin, tin-lead and nickel may be plated onto the conductance pattern(s) in alternative embodiments. The plated areas 116 may form solder pads 126 and the plated areas 118 may form contact fingers 128 as shown in FIG. 6.

Figure 6:
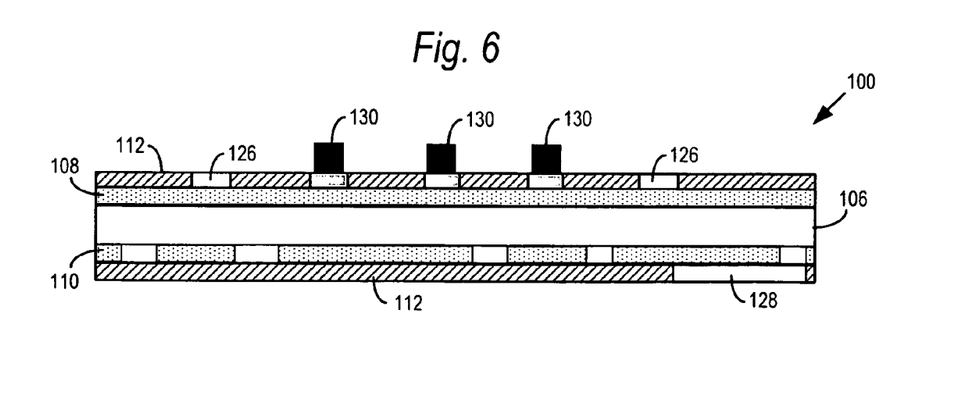
FIG. 6 is a cross-sectional side view of a substrate as in FIG. 5, and further including solder columns provided on the substrate according to an embodiment of the present invention.

In step 204, solder columns 130 may be applied to plated areas 120 as shown in FIG. 6. After surface mounting of a leadframe-based semiconductor package as explained hereinafter, the solder columns will provide structural support to the leadframe-based package to reduce mechanical stresses on the leadframe-based package during the subsequent encapsulation process. The solder mask 112 was removed in the areas 120 to provide a metallic surface to which the solder columns 130 may adhere. However, it is understood that no electrical connection in fact need be established between the conductance pattern formed in the conductive layer 108 and the solder columns 130.

Solder may be applied to areas 120 as a paste in a known solder printing process. As an alternative to solder paste applied in a solder printing process, it is understood that solder columns may be formed of solder balls of known construction and applied in a solder ball placement process. It is further contemplated that other structurally rigid materials may be used instead of solder paste or solder balls support the leadframe-based package during the encapsulation process. Such structurally rigid materials may be structurally rigid when applied to substrate 100, or may become structurally rigid after a heating or curing process.

Figure 7:
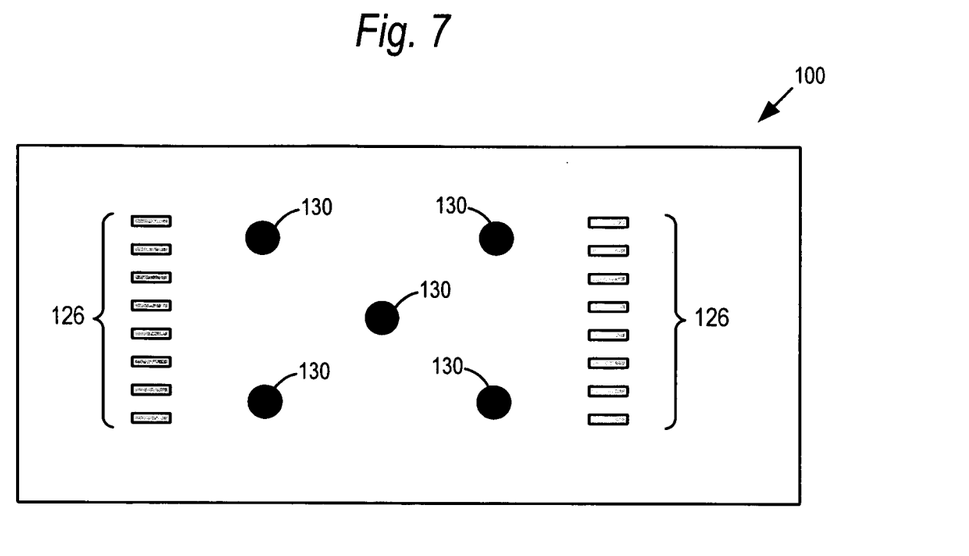
FIG. 7 is a top view of a substrate including solder columns according to an embodiment of the present invention.

Referring now to the cross-sectional view of FIG. 6 in the top view of FIG. 7, solder columns may be provided at positions so as to be relatively evenly distributed with respect to the bottom surface of a leadframe-based semiconductor package mounted thereover as explained hereinafter. In the embodiments shown in FIGS. 6 and 7, there are five such solder columns 130 positioned in a crisscross pattern. As explained in greater detail hereinafter, it is understood that there may be less than five or many more than five solder columns 130 provided on substrate 100 in alternative embodiments of the present invention, and the solder columns may be arranged in a variety of other patterns on substrate 100 in alternative embodiments of the present invention.

Figure 8:
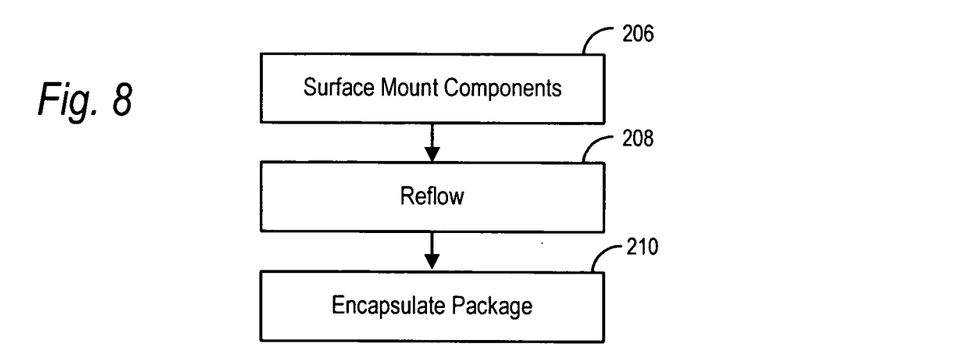
FIG. 8 is a flowchart illustrating the steps for completing fabrication of a semiconductor package according to embodiments of the present invention.
Figure 9:
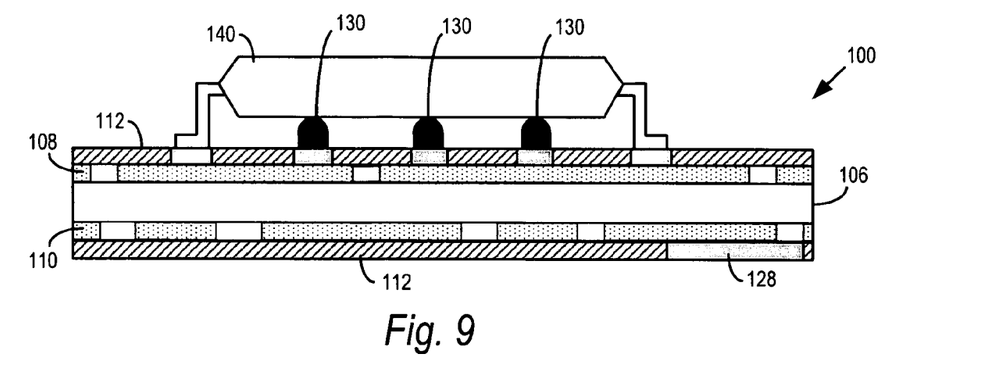
FIG. 9 is a cross-sectional side view of a substrate as in FIG. 6, and further including a semiconductor package surface mounted to the substrate to form an integrated circuit.

FIG. 8 is a flowchart showing the steps for the continued fabrication of a semiconductor package according to the present invention. In a step 206 a leadframe-based semiconductor package 140 (FIG. 9) may be surface mounted to substrate 100 by soldering leads of the package 140 to solder pads 126 in a known SMT or other mounting process. Leadframe-based semiconductor package 140 may be any of a variety of lead frame-based semiconductor packages including for example a TSOP package as described in the background of the invention. Leadframe-based package 140 may include one or more semiconductor die which may for example be flash memory chips (NOR/NAND), SRAM or DDT, and/or a controller chip such as an ASIC. However, it is understood that the configuration of leadframe-based semiconductor package 140 is not critical to the present invention and other semiconductor chip packages are contemplated. In addition to leadframe-based semiconductor package 140, other electronic components may be surface mounted to substrate 100 in step 180 in embodiments of the present invention.

The solder columns 130 may be applied at the same time as solder is applied to solder pads 126 to surface mount package 140. In alternative embodiments, the solder columns 130 may be applied before or after the solder applied to solder pads 126. In step 208, the substrate is heated to reflow and harden the solder in the solder columns and securely affix the surface mounted components at the solder pads. It is understood that the solder columns may be reflowed in a different heating process than that for securing the surface mounted components to the substrate 100.

In embodiments, the height of solder columns 130 is provided so as to lie in contact with the bottom surface of leadframe-based semiconductor package 140 after the surface mount process. In embodiments, the height of the bottom surface of leadframe-based semiconductor package 140 above the substrate may be between 50 and 150 μm, though it is understood that the space between package 140 and substrate 100 may be smaller or larger than that in alternative embodiments. The height of the solder columns 130 when applied may be slightly larger than the space between the leadframe-based semiconductor package 140 and the board, so that the package 140 slightly compresses the columns 130 when the package 140 is surface mounted to substrate 100. This ensures good contact between the package 140 and solder columns, and good structural support by the solder columns. It is understood that the columns 130 may be the same height as the space between the package 140 and substrate 100, or that the solder columns 130 may be slightly shorter than the space between the package 140 and substrate 100, in alternative embodiments. The solder columns may have a diameter (in a plane generally parallel to surface of substrate 100) of approximately 150 μm, though it is understood that the diameter of columns 130 may be smaller or larger than that in alternative embodiments.

As the solder columns 130 do not form part of an electrical circuit, the plated areas 120 which receive solder columns 130 may be electrically coupled to other electrical terminals (such as solder pads 116) on substrate 100, or the areas 120 may be electrically isolated from other electrical terminals. In further embodiments of the present invention, the plated areas 120 receiving solder columns 130 may be electrically connected to the ground.

Figure 10:
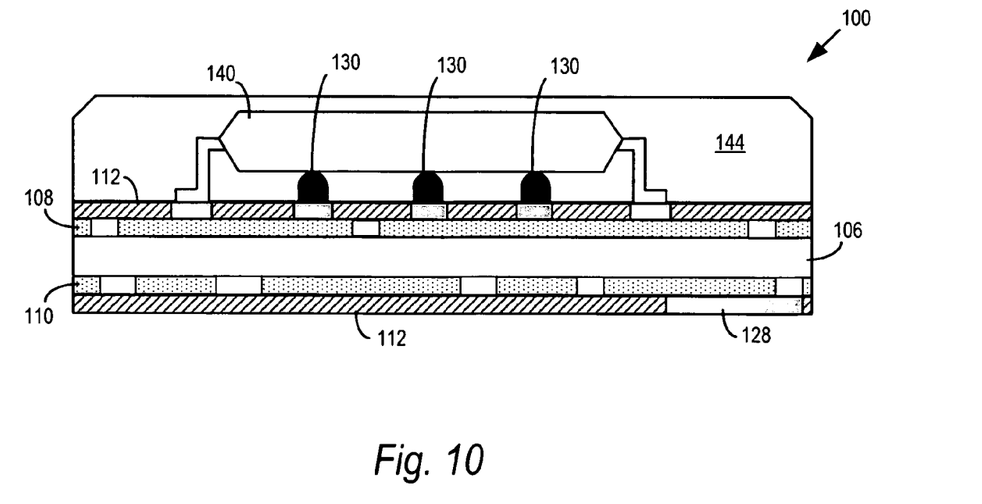
FIG. 10 illustrates a completed semiconductor package including solder columns according to embodiments of the present invention.

The mounted leadframe-based semiconductor package 140 and any other electronic components may define an integrated circuit on the substrate 100. Referring now to FIG. 10, after the integrated circuit is formed on substrate 100, the integrated circuit may be encapsulated in a molding compound 144 in a step 210 (FIG. 8) to form a finished SiP semiconductor package 150. Notably, during the encapsulation process, the solder columns 130 serve to drastically reduce mechanical stresses within leadframe-based semiconductor package 140 as a result of molding compound 144 flowing more quickly over the top of leadframe-based semiconductor package 140 than beneath package 140. In particular, lying in contact with the bottom surface of leadframe-based package 140, the solder columns provide an equal and opposite force to counteract the forces exerted on leadframe-based semiconductor package 140 by molding compound 144 during the encapsulation process. Thus, solder columns 130 effectively reduce mechanical stresses and prevent cracking of the semiconductor die within leadframe-based package 140 which cracking may ordinarily occur during the encapsulation process in conventional SiP packages.

While the present invention has been described above with respect to providing support to surface mounted semiconductor packages, it is understood that the present invention may be used to provide support for other electronic components surface mounted on substrate 100. In particular, the solder columns may be provided beneath a variety of surface mounted electronic components to provide support to the electronic components during the encapsulation process.

As indicated above, while five solder columns are shown in the figures, it is understood that fewer than five and many more than five solder columns may be provided in alternative embodiments of the present invention. For example, where leadframe-based semiconductor package 140 is a conventional 44 pin TSOP package, there may be between 40 and 70 solder columns, and more particularly between 50 and 60 solder columns, arranged in a grid evenly distributed beneath the lower surface of package 140. Moreover, in further embodiments, there may be only one, single solder column having a relatively large diameter so as to provide support beneath the package 140. It is further contemplated that, instead of individual solder columns, solder or other structural material may be applied beneath package 150 in geometries such as a ring, square, rectangle, etc. to accomplish the support and stress reduction properties of the present invention.

SiP package 150 may be used in any of a variety of applications, including for example as a flash memory card such as an SD-USB flash memory device manufactured by SanDisk Corporation of Sunnyvale, Calif. Other flash memory devices are contemplated, such as for example an SD Card, a Compact Flash, a Smart Media, a Mini SD Card, an MMC, an xD Card, a Transflash or a Memory Stick. It is understood that SiP package 150 may be used in a variety of other semiconductor device applications.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An integrated circuit including a substrate and an electronic component having leads for mounting the electronic component on the substrate with a surface of the electronic component spaced from an adjacent surface of the substrate, the integrated circuit comprising:
   one or more columns of structurally rigid material positioned on the substrate, extending between an electrically inactive surface of the electronic component and the adjacent surface of the substrate and lying in contact with the electrically inactive surface of the electronic component.

2. An integrated circuit as recited in claim 1, wherein the structurally rigid material is reflowed solder paste.

3. An integrated circuit as recited in claim 1, wherein the structurally rigid material is reflowed solder balls.

4. An integrated circuit as recited in claim 1, wherein the structurally rigid material is bonded to a metallic surface of the substrate in a heating process.

5. An integrated circuit as recited in claim 1, wherein the one or more columns of structurally rigid material comprise a plurality of columns extending between the surface of the electronic component and the adjacent surface of the substrate and lying in contact with the surface of the electronic component.

6. An integrated circuit as recited in claim 5, wherein the plurality of columns are arranged in a grid evenly disbursed on surface of the substrate.

7. An integrated circuit as recited in claim 1, wherein a column of the one or more columns has a height of approximately 50 microns to 150 microns.

8. An integrated circuit as recited in claim 1, wherein a column of the one or more columns has a diameter of approximately 50 microns to 150 microns.

9. A semiconductor package, comprising:
   a substrate;
   an electronic component having leads for mounting the electronic component on the substrate with a surface of the electronic component spaced from an adjacent surface of the substrate, the electronic component including inactive areas on a surface of the electronic component;
   one or more solder columns positioned on the substrate, extending between the inactive areas on the surface of the electronic component and the adjacent surface of the substrate and lying in contact with the inactive areas of the surface of the electronic component; and
   a molding compound for encapsulating the electronic component in a molding process, the one or more solder columns reducing a mechanical stress on the electronic component during the molding process.

10. A semiconductor package as recited in claim 9, wherein the one or more solder columns are formed from solder paste deposited on the substrate and hardened in a heating process.

11. A semiconductor package as recited in claim 9, wherein the one or more solder columns are formed from solder balls deposited on the substrate and hardened in a heating process.

12. A semiconductor package as recited in claim 9, wherein the electronic component is a leadframe-based semiconductor package surface mounted on the substrate.

13. A semiconductor package as recited in claim 9, wherein the electronic component is a TSOP semiconductor package surface mounted on the substrate.

14. A semiconductor package as recited in claim 9, wherein the one or more solder columns are applied to a metallic area of the substrate and hardened in a heating process.

15. A semiconductor package as recited in claim 14, wherein the electronic component is affixed to the substrate by solder in the heating process.

16. A semiconductor package as recited in claim 9, wherein the one or more solder columns comprise a plurality of solder columns are arranged in a grid evenly disbursed on surface of the substrate.

17. A semiconductor package as recited in claim 9, wherein a solder column of the one or more solder columns has a height of approximately 50 microns to 150 microns.

18. A semiconductor package as recited in claim 9, wherein a solder column of the one or more solder columns has a diameter of approximately 50 microns to 150 microns.

19. A semiconductor package as recited in claim 9, wherein the semiconductor package is an SiP package.

20. A semiconductor package, comprising:
   a substrate;
   an encapsulated leadframe-based semiconductor package having a semiconductor die completely encapsulated within the leadframe-based semiconductor package and leads for mounting the leadframe-based semiconductor package on the substrate with a surface of the leadframe-based semiconductor package spaced from an adjacent surface of the substrate;
   one or more solder columns deposited on metallic portions of the substrate, extending between an encapsulated surface of the leadframe-based semiconductor package and the adjacent surface of the substrate and lying in contact with the encapsulated surface of the leadframe-based semiconductor package; and
   a molding compound for encapsulating the leadframe-based semiconductor package in a molding process, the one or more solder columns reducing a mechanical stress on the electronic component during the molding process.

21. A semiconductor package as recited in claim 20, wherein the one or more solder columns are formed from solder paste deposited on the substrate and hardened in a heating process.

22. A semiconductor package as recited in claim 20, wherein the one or more solder columns are formed from solder balls deposited on the substrate and hardened in a heating process.

23. A semiconductor package as recited in claim 20, wherein the leadframe-based semiconductor package is a TSOP semiconductor package surface mounted on the substrate.

24. A semiconductor package as recited in claim 20, wherein the one or more solder columns comprise a plurality of solder columns are arranged in a grid evenly disbursed on surface of the substrate.

* * * * *